United States Patent [19]

Jarrett et al.

[11] 4,017,754
[45] Apr. 12, 1977

[54] ACTUATING DEVICES

[75] Inventors: Boaz Antony Jarrett, Sevenoaks; Alec Harry Seilly, North Wembley, both of England

[73] Assignee: Simms Group Research & Development Limited, Birmingham, England

[22] Filed: Dec. 17, 1975

[21] Appl. No.: 641,369

[30] Foreign Application Priority Data

Dec. 21, 1974 United Kingdom ............ 55337/74

[52] U.S. Cl. ................................................ 310/26
[51] Int. Cl.² .................................... H01L 41/12
[58] Field of Search ............................ 310/26, 27

[56] References Cited

UNITED STATES PATENTS

| | | | |
|---|---|---|---|
| 3,353,040 | 11/1967 | Abbott | 310/27 |
| 3,406,302 | 10/1968 | Lanyi et al. | 310/26 |
| 3,612,967 | 10/1971 | Lee | 310/27 X |

OTHER PUBLICATIONS

IBM Tech. Disclosure Bulletin, "Magnetostrictive Transducer", Young, vol. 6, No. 12, 5/64.

*Primary Examiner*—Donovan F. Duggan

[57] ABSTRACT

An actuating device comprises an elongated member formed from a material having the property of magnetostriction and a winding which can be energized to cause flow of magnetic flux in the member so as to cause a physical change in the dimension. The elongated member is divided into a plurality of magnetic circuits disposed along the length of the member and portions of adjacent magnetic circuits are adjacent each other. The directions of flux flow in adjacent magnetic circuits is such that in said portions of two adjacent circuits, the flux flows are in the same direction.

13 Claims, 4 Drawing Figures

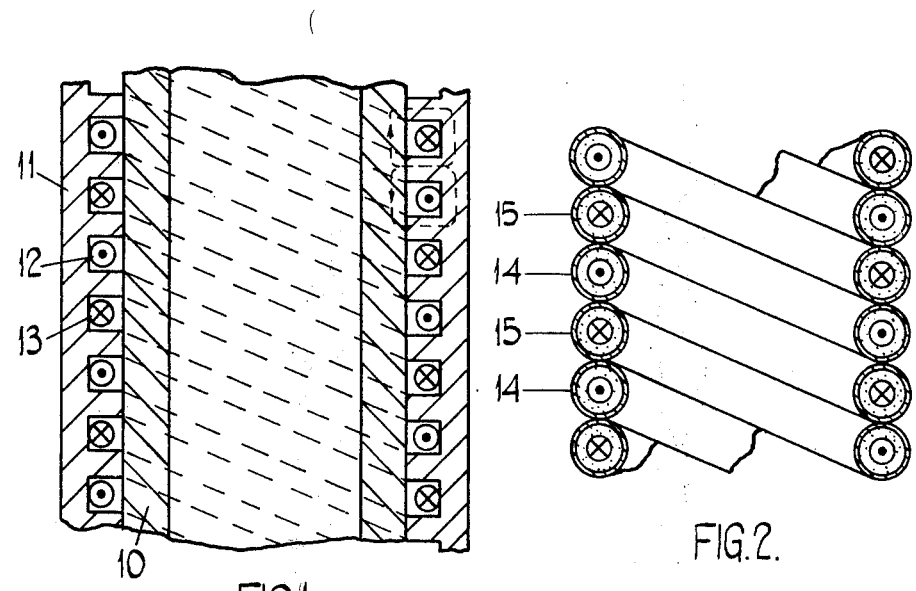
FIG.1.
FIG.2.
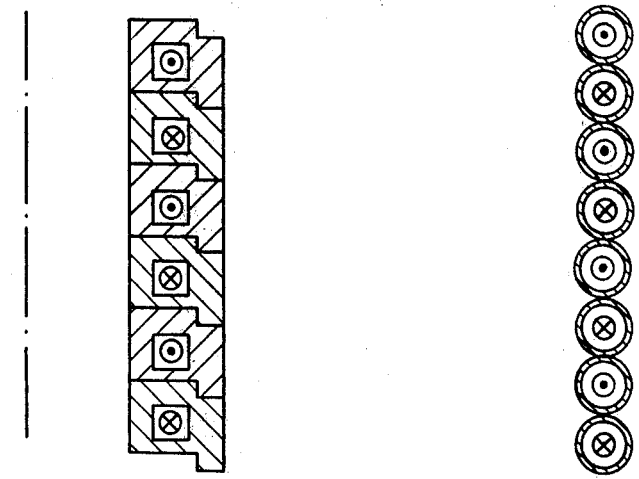
FIG.3.
FIG.4.

ACTUATING DEVICES

This invention relates to actuating devices of the kind comprising an elongated member formed from a material having the property of magneto-striction, and a winding which can be energised to cause flow of magnetic flux in the member thereby to cause a change in a physical dimension of the member.

The object of the invention is to provide such an actuating device in a simple and convenient form.

According to the invention, said elongated member is divided into a plurality of magnetic circuits disposed along the length of the member, portions of adjacent magnetic circuits being adjacent each other, the directions of flux flow in adjacent magnetic circuits being such that in said portions of two adjacent magnetic circuits, the flux flows are in the same direction.

The examples of actuating devices in accordance with the invention will now be described with reference to the accompanying drawings in which:

FIG. 1 is the sectional side elevation through one example of an actuator,

FIG. 2 is a view similar to FIG. 1 showing another example,

FIG. 3 shows a modification of the example of FIG. 2, and

FIG. 4 shows a further example of an actuator.

Referring to FIG. 1 of the drawings, the actuating device comprises an elongated member 10 of tubular form, and formed from a material which exhibits the property of magneto-striction. Surrounding the member 10 is a further member 11 conveniently of hollow cylindrical form and formed from magnetisable material.

In the inner surface of the member 11, there is formed in the particular example, a two start thread. It will be understood however that a multiple of a two start thread may be provided. As will be seen from the drawing, the grooves and the ribs have substantially parallel sides, and the crests of the ribs have flat tops which are in close proximity to the surface of the member 10. The thickness of the wall of the member 10 is as small as possible and conveniently is equal to the thickness of the wall of the member 11 between the bases of the grooves 12, 13 and its outer peripheral wall.

An electrical winding is provided in the grooves 12 and 13, these being the two grooves defined by the two start helical thread. As shown in the drawing, a single turn winding is employed, but a multi-turn winding can be used and the method of winding is such that the wire forming the winding is laid in the groove 12 starting from one end of the member and is returned back to said one member from the other end of the member by way of the groove 13.

When the winding is supplied with electric current, the ribs will be magnetically polarised adjacent ribs having opposite magnetic polarity. Each rib forms the adjacent portions of two adjacent magnetic circuits, and it will be seen that the direction of flux flow in each rib due to the flux flow in the adjacent magnetic circuits is in the same direction. This is because the direction of current flow in adjacent portions of the winding is in the opposite direction.

The flow of current described above subjects the material from which the member 10 is formed, to a strong magnetising flux, and therefore the member 10 changes dimensions due to the magneto-striction effect. The change in dimension may result in elongation or contraction of the member depending on the type of material.

One end of the member 10 will in use, be fixed to a support and the movement which is obtained at the other ends of the members can be used to actuate for instance, a valve element of a fluid control valve.

The two members may both be formed from magneto-strictive material. In the case where the two members are formed from the same material it is necessary because the change in dimension takes place without a change in volume, to ensure that there is clearance between the crests of the ribs and the member 10. Alternatively the ribs may be formed separately from magneto-strictive material of the opposite type and in this case the dimensions of the ribs can be such that the air gaps are substantially zero. In the case where the ribs are formed separately the members 10 and 11 are spaced by a gap which in the complexed assembly is occupied by the ribs and windings.

In the example which is shown in FIG. 2, a pair of interengaged helical coils 14, 15 is provided, the coils being constructed from tubular magneto-strictive material. Within each coil is an electrical conductor, the conductors being provided with insulation or alternatively, the spaces between the conductors and the sheaths are filled with an insulation material.

The direction of flow of current in the two windings is in the opposite direction, so that the flow of flux is in the same direction at the points of contact of the adjacent convolutions of the coils.

In the examples of FIGS. 1 and 2 the components are of annular cylindrical form and the same applies with respect to the example which is shown in FIG. 3. This example is substantially identical with that shown in FIG. 2, with the exception that the cross section of the coils is modified. The section being generally rectangular with a displaced side portions which interlocks the adjacent turns. It will be understood however that with the examples of FIGS. 1, 2 and 3 instead of being cylindrical form, they can be of some other form such as for instance, an oval shape or a rectangular shape.

With reference now to FIG. 4. The example shown therein in many respects is similar to that which is shown in FIG. 2 except that a single length of tube formed from magneto-strictive material is provided and the tube is formed into zig zag form with the adjacent portions of the tube touching each other. Clearly a single winding is employed, but because of the way in which the member is formed the current flowing in adjacent portions of the tube is in the opposite direction so that the flux flow in the adjacent portions of the tube is in the same direction.

In a further modification, the construction of FIG. 1 is employed, one of the members being of flat form whilst the other member is provided with a plurality of laterally extending slots in its surface which is presented to the one member. A winding passes in zig zag fashion through the slots, and when the winding is supplied with electric current, expansion of the members occurs. It will be appreciated that this modification can be regarded as an opened out version of the example shown in FIG. 1.

We claim:

1. An actuating device of the kind comprising an elongated member of annular form formed from a material having the property of magneto-striction, a winding which can be energised to cause a flow of magnetic flux in the member thereby to cause a change in a physical dimension of the member, said member being divided into a plurality of magnetic circuits disposed along the length of the member, portions of adjacent magnetic circuits being adjacent each other, the directions of flux flow in adjacent magnetic circuits being such that in said portions of two adjacent magnetic circuits, the flux flows are in the same direction, and a further member having a peripheral side surface in close proximity to a peripheral side surface of said first mentioned member, said further annular member having a two or a multiple of two, start helical thread like form in said peripheral side surface, said winding being accommodated in the grooves defined by the thread like form, said winding being arranged so that the direction of current flow in the two grooves or the adjacent grooves is in the opposite direction.

2. A device as claimed in claim 1, in which said winding is a continuous winding extending along one groove from one end to the other end of the further member and returning along the other or an adjacent groove to said one end of the further member.

3. A device as claimed in claim 1 in which said further annular member is formed material having the property of magneto-striction.

4. An actuating device of the kind comprising an elongated member of annular form formed from a material having the property of magneto-striction, a winding which can be energised to cause a flow of magnetic flux in the member thereby to cause a change in a physical dimension of the member, said member being divided into a plurality of magnetic circuits disposed along the length of the member, portions of adjacent magnetic circuits being adjacent each other, the directions of flux flow in adjacent magnetic circuits being such that in said portions of two adjacent magnetic circuits, the flux flows are in the same direction, said member being formed as a pair of interengaged helical coils, the coils being formed from hollow magneto-strictive material, and each coil having a winding therein, the direction of current flow in the two windings being in the opposite directions.

5. A device as claimed in claim 4 in which the coils are formed from tubular material.

6. A device as claimed in claim 4 in which the coils are formed from material of rectangular section.

7. A device as claimed in claim 6 in which the section has a displaced side portion to interlock the adjacent turns.

8. An actuating device of the kind comprising an elongated member formed from a material having the property of magneto-striction, a winding which can be energised to cause a flow of magnetic flux in the member thereby to cause a change in a physical dimension of the member, said member being divided into a plurality of magnetic circuits disposed along the length of the member, portions of adjacent magnetic circuits being adjacent each other, the directions of flux flow in adjacent magnetic circuits being such that in said portions of two adjacent magnetic circuits, the flux flows are in the same direction, said member being substantially flat and comprising a plurality of tubular elements disposed in side by side relationship, the direction of current flow in the windings in the adjacent elements being in the opposite direction.

9. A device as claimed in claim 8 in which said tubular member elements are formed by deforming a continuous tube.

10. An actuating device of the kind comprising an elongated member formed from a material having the property of magneto-striction, a winding which can be energised to cause a flow of magnetic flux in the member thereby to cause a change in a physical dimension of the member, said member being divided into a plurality of magnetic circuits disposed along the length of the member, portions of adjacent magnetic circuits being adjacent each other, the directions of flux flow in adjacent magnetic circuits being such that in said portions of two adjacent magnetic circuits, the flux flows are in the same direction, said member being substantially flat, and a further member is provided which is positioned in close proximity to the first mentioned member, one of said members defining in its face presented to the other member a plurality of slots which accommodate windings, the direction of current flow in the windings in adjacent slots being in the opposite direction.

11. A device as claimed in claim 10 in which said further member is formed from magneto-strictive material.

12. An actuating device of the kind comprising an elongated member of annular form formed from a material having the property of magneto-striction, a winding which can be energised to cause a flow of magnetic flux in the member thereby to cause a change in a physical dimension of the member, said member being divided into a plurality of magnetic circuits disposed along the length of the member, portions of adjacent magnetic circuits being adjacent each other, the directions of flux flow in adjacent magnetic circuits, the flux flows are in the same direction, a further member having a peripheral side surface spaced from a side surface of said first mentioned member, said members both being formed from the same type of magneto-strictive material, two or a multiple of two helical ribs disposed in the annular space defined between the two members, said ribs being formed from magneto-strictive material of the opposite type to the material from which said members are formed, said winding being located within the spaces defined between said ribs and being arranged so that the direction of current flow in the portions of the winding in the spaces or in adjacent spaces is in the opposite direction.

13. A device as claimed in claim 12 in which said winding is a continuous winding extending along one space from one end to the other end and returning along the other on an adjacent space.

* * * * *